United States Patent
Wuu et al.

(10) Patent No.: US 8,603,886 B2
(45) Date of Patent: Dec. 10, 2013

(54) INTERMEDIATE EPITAXIAL STRUCTURE AND METHOD FOR FABRICATING AN EPITAXIAL STRUCTURE

(75) Inventors: Dong-Sing Wuu, Taichung (TW); Ray-Hua Horng, Taichung (TW); Tsung-Yen Tsai, Taichung (TW)

(73) Assignee: National Chung-Hsing University, Taichung (TW)

( * ) Notice: Subject to any disclaimer, the term of this patent is extended or adjusted under 35 U.S.C. 154(b) by 50 days.

(21) Appl. No.: 13/331,423

(22) Filed: Dec. 20, 2011

(65) Prior Publication Data
US 2012/0161149 A1  Jun. 28, 2012

(30) Foreign Application Priority Data
Dec. 23, 2010 (TW) .............................. 99145520 A (51) Int. Cl.
*H01L 21/20* (2006.01)
(52) U.S. Cl.
USPC ........... 438/341; 438/478; 438/384; 438/509; 257/76; 257/E29.089; 257/E21.09

(58) Field of Classification Search
USPC ................................. 438/341, 384, 478–509
See application file for complete search history.

(56) References Cited

U.S. PATENT DOCUMENTS

| | | | |
|---|---|---|---|
| 2002/0137342 A1* | 9/2002 | Ishida et al. | 438/689 |
| 2010/0200880 A1* | 8/2010 | Sit et al. | 257/98 |
| 2010/0270653 A1* | 10/2010 | Leitz et al. | 257/618 |
| 2012/0028446 A1* | 2/2012 | Cheng et al. | 438/478 |

\* cited by examiner

Primary Examiner — Mamadou Diallo
(74) Attorney, Agent, or Firm — Foley & Lardner LLP (57) ABSTRACT

A method for fabricating an epitaxial structure includes: (a) forming over a temporary substrate a patterned sacrificial layer that partially exposes the temporary substrate; (b) growing laterally and epitaxially a temporary epitaxial film over the patterned sacrificial layer and the temporary substrate; (c) forming over the temporary epitaxial film an etching-stop layer; (d) forming an epitaxial layer unit over the etching-stop layer; (e) removing the patterned sacrificial layer using a first etchant; and (f) removing the temporary epitaxial film using a second etchant.

19 Claims, 8 Drawing Sheets

INTERMEDIATE EPITAXIAL STRUCTURE AND METHOD FOR FABRICATING AN EPITAXIAL STRUCTURE

CROSS-REFERENCE TO RELATED APPLICATION

This application claims priority of Taiwanese application no. 099145520, filed on Dec. 23, 2010.

BACKGROUND OF THE INVENTION

1. Field of the Invention

This invention relates to an intermediate epitaxial structure and a method for fabricating an epitaxial structure.

2. Description of the Related Art

A substrate, which is suitable for epitaxial growth of an epitaxial layer in an optoelectronic device, often has poor thermal or electrical conductivity. Therefore, in consideration of the above problems and the epitaxial quality, the fabrication of the optoelectronic device usually includes a step of removing the epitaxial layer from a temporary substrate used for epitaxial growth of the epitaxial layer.

Usually, a sacrificial layer is formed between the epitaxial layer and the temporary substrate, and thus, the epitaxial layer can be removed from the temporary substrate by etching the sacrificial layer using a fluorine-containing etchant, such as hydrofluoric acid (HF).

However, although the fluorine-containing etchant can rapidly etch the sacrificial layer, the etchant is likely to result in corrosion of etching equipments and would be harmful to the environment.

SUMMARY OF THE INVENTION

Therefore, an object of the present invention is to provide an intermediate epitaxial structure and a method for fabricating an epitaxial structure that can overcome the aforesaid drawbacks associated with the prior art.

According to one aspect of this invention, a method for fabricating an epitaxial structure comprises:

(a) forming over a temporary substrate a patterned sacrificial layer that partially exposes the temporary substrate;

(b) growing laterally and epitaxially a temporary epitaxial film over the patterned sacrificial layer and the temporary substrate;

(c) forming over the temporary epitaxial film an etching-stop layer;

(d) forming an epitaxial layer unit over the etching-stop layer;

(e) removing the patterned sacrificial layer using a first etchant, the patterned sacrificial layer having an etching rate greater than that of the temporary epitaxial film; and (f) removing the temporary epitaxial film using a second etchant to separate the temporary substrate from assembly of the etching-stop layer and the epitaxial layer unit, the temporary epitaxial film having an etching rate greater than that of the etching-stop layer.

According to another aspect of this invention, an intermediate epitaxial structure comprises:

a temporary substrate;

a patterned sacrificial layer formed on the temporary substrate to partially expose the temporary substrate;

a temporary epitaxial layer laterally and epitaxially grown on the patterned sacrificial layer and the temporary substrate exposed from the patterned sacrificial layer;

an etching-stop layer formed on the temporary epitaxial layer oppositely of the patterned sacrificial layer; and an epitaxial layer unit formed on the etching-stop layer opposite to the temporary epitaxial layer.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
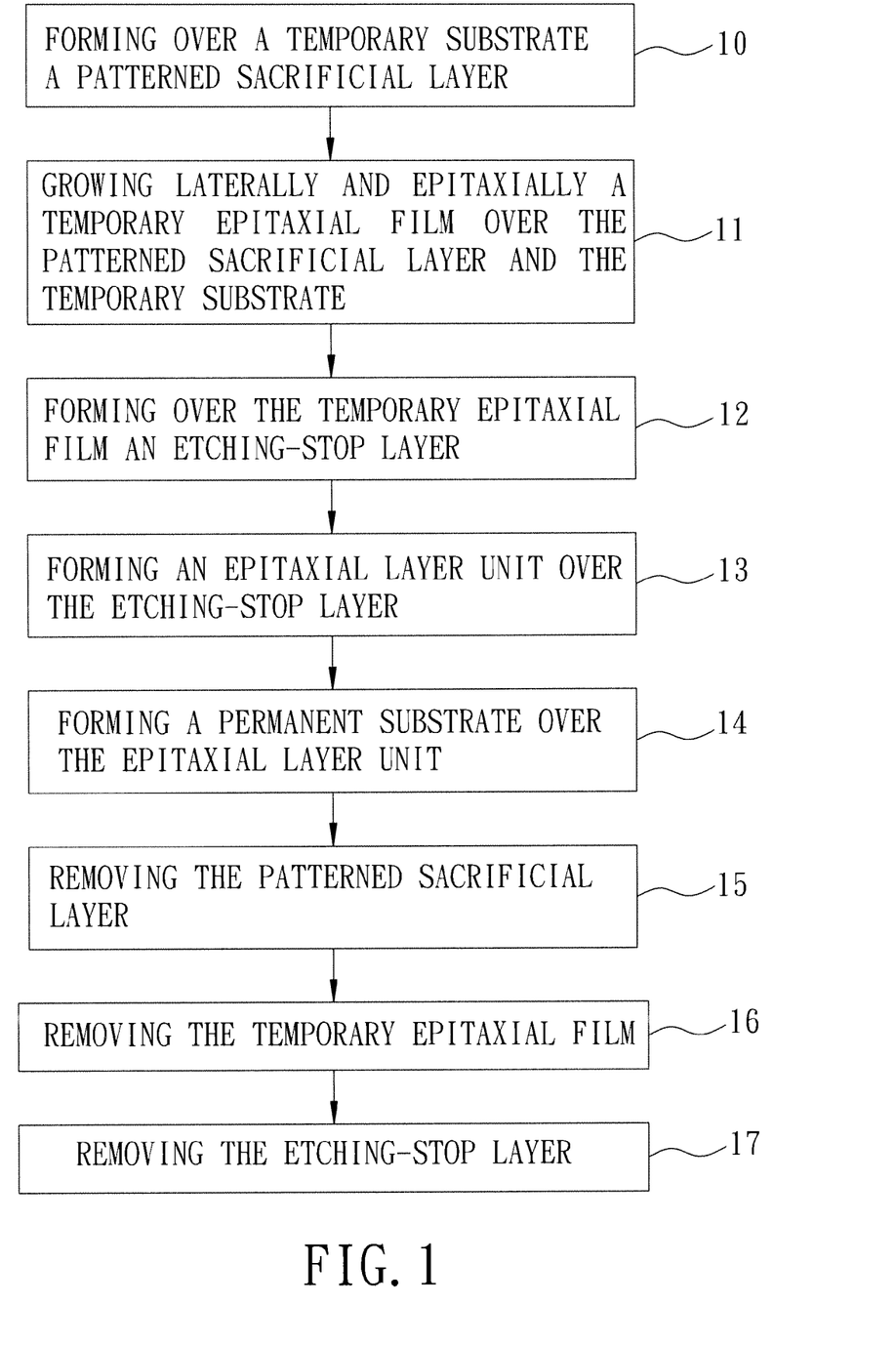
FIG. 1 is a flowchart illustrating the preferred embodiment of a method for fabricating an epitaxial structure according to the present invention.

Referring to FIG. 1, the preferred embodiment of a method for fabricating an epitaxial structure according to this invention comprises the following steps.

Figure 2:
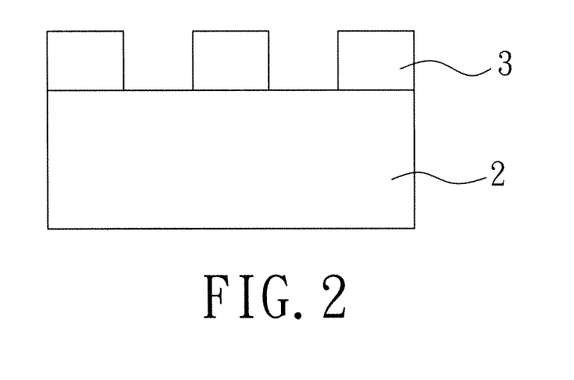
FIGS. 2 to 9 are schematic diagrams illustrating consecutive steps of the method illustrated in FIG. 1.

In step 10, a patterned sacrificial layer 3 is formed over a temporary substrate 2 (see FIG. 2). The temporary substrate 2 may be made of, for example, silicon, sapphire ($Al_2O_3$), silicon carbide, gallium arsenide, etc., and is exposed partially from the patterned sacrificial layer 3. The patterned sacrificial layer 3 is made of oxide, and is preferably made of silicon oxide.

Figure 3:
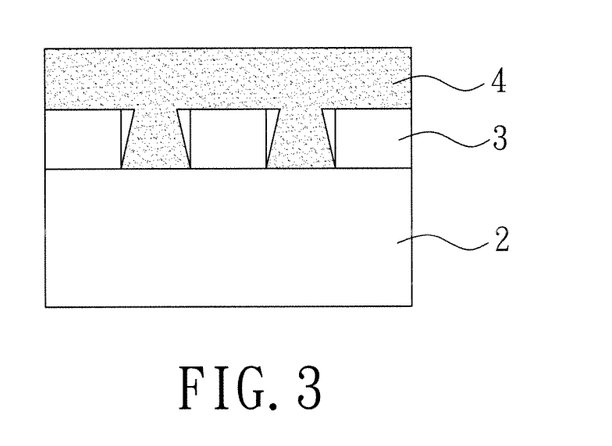

In step 11, a temporary epitaxial film 4 is grown laterally and epitaxially over the patterned sacrificial layer 3 and the temporary substrate 2 (see FIG. 3). In the preferred embodiment, the temporary epitaxial film 4 is made of gallium nitride (GaN).

Figure 4:
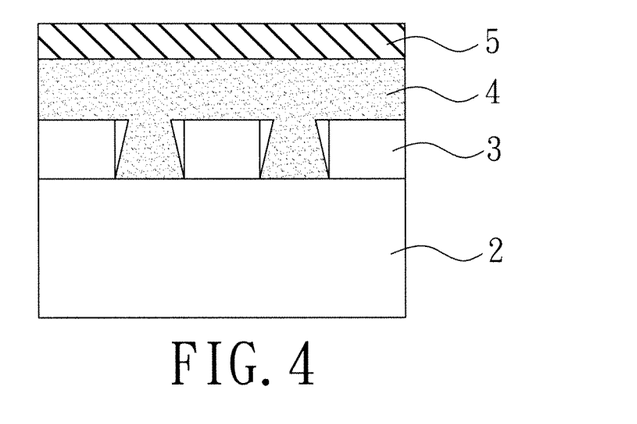

In step 12, a first etching-stop layer 5 is epitaxially grown over the temporary epitaxial film 4 to have a thickness greater than 0.001 micron, and has an epitaxial temperature ranging from 500° C. to 1200° C. The first etching-stop layer 5 is made of aluminum-containing nitride. Preferably, the aluminum-containing nitride includes at least 5% atomic ratio of aluminum, such as aluminum nitride, aluminum indium gallium nitride, etc.

Figure 5:
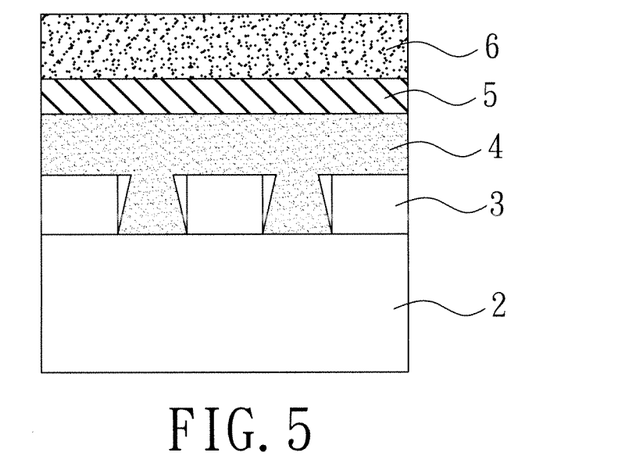

In step 13, an epitaxial layer unit 6 is grown over the first etching-stop layer 5 (see FIG. 5) so as to form an intermediate epitaxial structure. The epitaxial layer unit 6 may be a gallium nitride layer for epitaxial growth of different elements thereon in subsequent processes, or may be a light emitting diode (LED) element.

Figure 6:
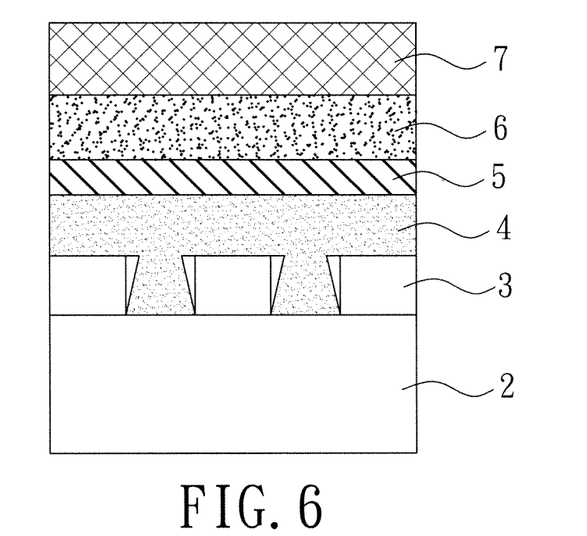

In step 14, a permanent substrate 7 is formed over the epitaxial layer unit 6 oppositely of the first etching-stop layer 5. The permanent substrate 7 may be made of silicon, copper-containing material, molybdenum, flexible material, etc. Besides, based on actual requirements, the permanent substrate 7 may be made of a material having superior thermal conductivity to serve as a heat-dissipation substrate.

Figure 7:
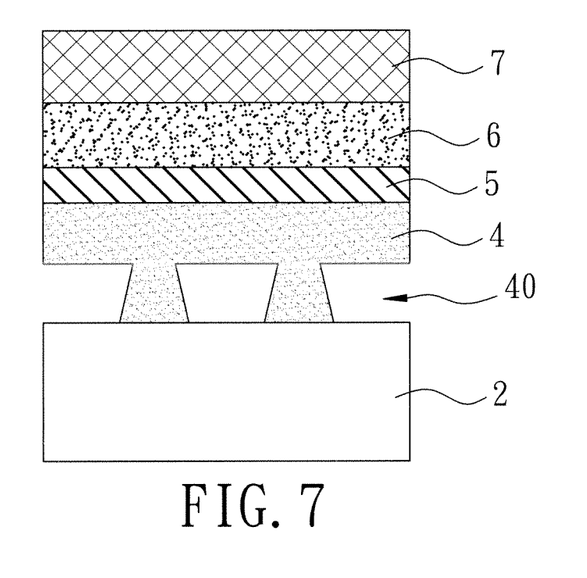

In step 15, the patterned sacrificial layer 3 is removed using a first etchant (see FIG. 7). The patterned sacrificial layer 3 has an etching rate greater than that of the temporary epitaxial film 4. The first etchant is preferably a fluorine-containing solution, such as hydrofluoric acid (HF), a buffered oxide etch (BOE) solution, etc., and is more preferably HF. Because the sacrificial layer 3 is patterned, the fluorine-containing solution, which has adverse affect to etching equipments and the environment as previously described in the Description of the Related Art, can be used in a reduced amount.

After removing the patterned sacrificial layer 3, channels 40 are formed between the temporary epitaxial film 4 and the temporary substrate 2. Thus, the temporary epitaxial film 4 has an increased surface area that can be reactive to a second etchant, thereby resulting in an increase in the etching rate of the temporary epitaxial film 4.

Figure 8:
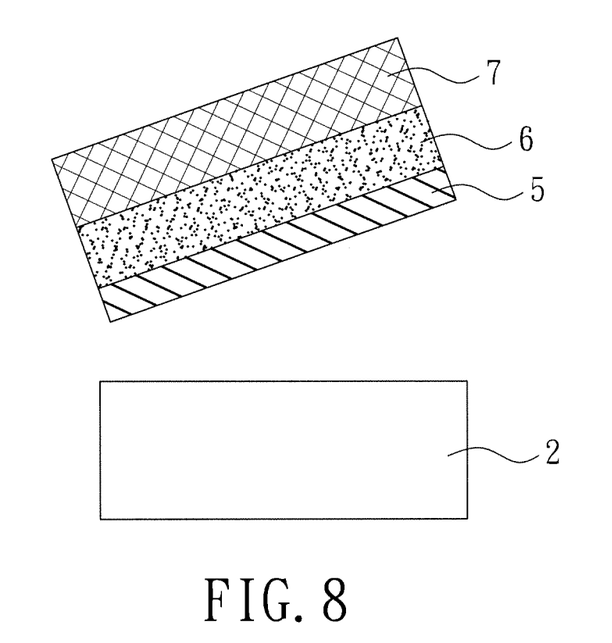

In step 16, the second etchant is introduced into the channels 40 to etch and remove the temporary epitaxial film 4. Accordingly, as shown in FIG. 8, the temporary substrate 2 is removed from assembly of the first etching-stop layer 5, the epitaxial layer unit 6, and the permanent substrate 7. The second etchant is preferably selected from a potassium hydroxide solution and a phosphoric acid solution, and is more preferably a phosphoric acid solution. In this step, the temporary epitaxial film 4 has an etching rate greater than that of the first etching-stop layer 5. Preferably, the etching rate of the temporary epitaxial film 4 is at least five times greater than that of the first etching-stop layer 5. As such, the first etching-stop layer 5 can be used to protect the epitaxial layer unit 6 from etching by the second etchant. Thus, with the first etching-stop layer 5, the epitaxial layer unit 6 is unlikely to be etched by the second etchant.

Figure 10:
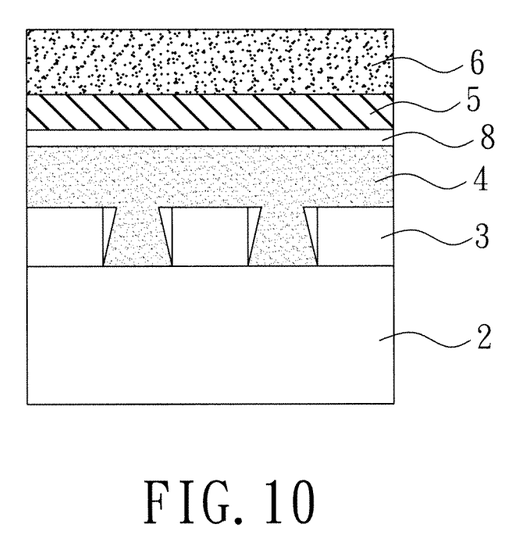
FIG. 10 is a schematic diagram illustrating a step of forming a second etching-stop layer on a lower surface of a first etching-stop layer, which is further included in the method illustrated in FIG. 1.
Figure 11:
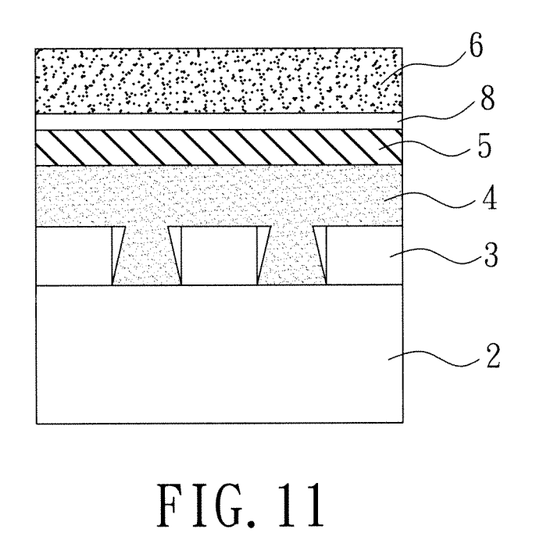
FIG. 11 is a schematic diagram illustrating a step of forming a second etching-stop layer on an upper surface of the first etching-stop layer, which is further included in the method illustrated in FIG. 1.
Figure 12:
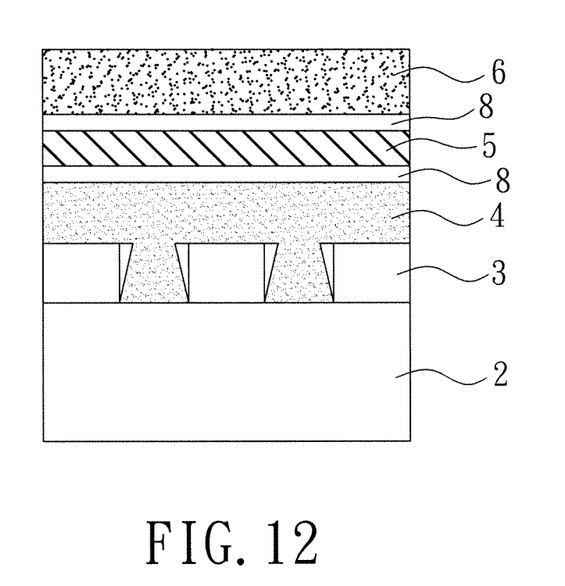
FIG. 12 is a schematic diagram illustrating a step of forming two second etching-stop layers on the upper and lower surfaces of the first etching-stop layer, which is further included in the method illustrated in FIG. 1.

In other embodiments, a second etching-stop layer 8 may be formed on at least one of upper and lower surfaces of the first etching-stop layer 5 (see FIGS. 10 to 12). The second etching-stop layer 8 is preferably made of a material selected from a nitrogen-containing material and a silicon-containing material, has a thickness greater than 0.001 micron, and has an epitaxial temperature ranging from 500° C. to 1200° C. Examples of the nitrogen-containing material include gallium nitride, indium gallium nitride, etc. The nitrogen-containing material is preferably a silicon nitride material (for example, $Si_3N_4$) that includes at least 20% atomic ratio of nitrogen. Examples of the silicon-containing material include silicon, silicon nitride, etc. The silicon-containing material is preferably a silicide material (for example, $CrSi_x$, $TaSi_x$) that includes at least 30% atomic ratio of silicon. With the first and second etching-stop layers 5, 8, the epitaxial layer unit 6 can be protected in a more efficient way.

Figure 9:
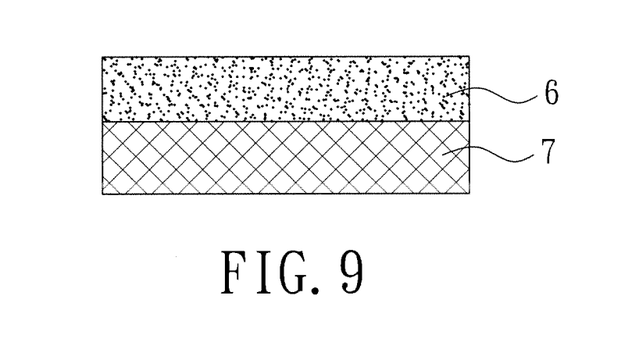

Finally, in step 17, the first etching-stop layer 5 and the second etching-stop layer(s) 8 (if any) are removed (see FIG. 9). An inductive coupling plasma etching process (ICP), a reactive ion etch process (RIE), or a polishing process can be used in this step without causing damage to the epitaxial layer unit 6.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating an epitaxial structure, comprising:
    (a) forming over a temporary substrate a patterned sacrificial layer that partially exposes the temporary substrate;
    (b) growing laterally and epitaxially a temporary epitaxial film over the patterned sacrificial layer and the temporary substrate;
    (c) forming over the temporary epitaxial film a first etching-stop layer;
    (d) forming an epitaxial layer unit over the first etching-stop layer;
    (e) removing the patterned sacrificial layer using a first etchant, the patterned sacrificial layer having an etching rate greater than that of the temporary epitaxial film; and
    (f) removing the temporary epitaxial film using a second etchant to separate the temporary substrate from assembly of the first etching-stop layer and the epitaxial layer unit, the temporary epitaxial film having an etching rate greater than that of the first etching-stop layer.

2. The method of claim 1, wherein the patterned sacrificial layer is made of silicon oxide.

3. The method of claim 1, further comprising, after step (d):
    (g) forming a permanent substrate over the epitaxial layer unit oppositely of the first etching-stop layer.

4. The method of claim 1, wherein, in step (f), the etching rate of the temporary epitaxial film is at least five times greater than that of the first etching-stop layer.

5. The method of claim 1, wherein the first etching-stop layer is made of aluminum-containing nitride.

6. The method of claim 5, wherein the aluminum-containing nitride includes at least 5% atomic ratio of aluminum.

7. The method of claim 1, wherein the first etchant is a fluorine-containing solution.

8. The method of claim 1, wherein the second etchant is selected from the group consisting of a potassium hydroxide solution and a phosphoric acid solution.

9. The method of claim 1, further comprising:
    (h) forming a second etching-stop layer on one of upper and lower surfaces of the first etching-stop layer.

10. The method of claim 9, wherein the second etching-stop layer is made of a material selected from the group consisting of a nitrogen-containing material and a silicon-containing material.

11. The method of claim 10, wherein the nitrogen-containing material is a silicon nitride material that includes at least 20% atomic ratio of nitrogen.

12. The method of claim 10, wherein the silicon-containing material is a silicide material that includes at least 30% atomic ratio of silicon.

13. An intermediate epitaxial structure, comprising:
    a temporary substrate;
    a patterned sacrificial layer formed on said temporary substrate to partially expose said temporary substrate;
    a temporary epitaxial layer laterally and epitaxially grown on said patterned sacrificial layer and said temporary substrate exposed from said patterned sacrificial layer;
    a first etching-stop layer formed on said temporary epitaxial layer oppositely of said patterned sacrificial layer;
    an epitaxial layer unit formed on said first etching-stop layer opposite to said temporary epitaxial layer; and
    a second etching-stop layer formed on one of upper and lower surfaces of said first etching-stop layer.

14. The intermediate epitaxial structure of claim 13, wherein said patterned sacrificial layer is made of silicon oxide, and said temporary epitaxial film is made of gallium nitride.

15. The intermediate epitaxial structure of claim 13, wherein said first etching-stop layer is made of aluminum-containing nitride.

16. The intermediate epitaxial structure of claim 15, wherein said aluminum-containing nitride includes at least 5% atomic ratio of aluminum.

17. The intermediate epitaxial structure of claim 13, wherein said second etching-stop layer is made of a material selected from the group consisting of a nitrogen-containing material and a silicon-containing material.

18. The intermediate epitaxial structure of claim 17, wherein said nitrogen-containing material is a silicon nitride material that includes at least 20% atomic ratio of nitrogen.

19. The intermediate epitaxial structure of claim 17, wherein said silicon-containing material is a silicide material that includes at least 30% atomic ratio of silicon.

* * * * *